(12) United States Patent
Nakamura et al.

(10) Patent No.: US 10,903,130 B2
(45) Date of Patent: Jan. 26, 2021

(54) SEMICONDUCTOR APPARATUS AND MANUFACTURING METHOD OF SEMICONDUCTOR APPARATUS

(71) Applicant: FUJI ELECTRIC CO., LTD., Kanagawa (JP)

(72) Inventors: Yoko Nakamura, Matsumoto (JP); Norihiro Nashida, Kita-azumi-gun (JP); Yuichiro Hinata, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/690,278

(22) Filed: Aug. 30, 2017

(65) Prior Publication Data
US 2018/0114735 A1    Apr. 26, 2018

(30) Foreign Application Priority Data
Oct. 20, 2016   (JP) ................. 2016-205901

(51) Int. Cl.
*H01L 23/31* (2006.01)
*H01L 23/538* (2006.01)
(Continued)

(52) U.S. Cl.
CPC ...... *H01L 23/3121* (2013.01); *H01L 21/4853* (2013.01); *H01L 21/565* (2013.01);
(Continued)

(58) Field of Classification Search
CPC ....... H01L 2924/181; H01L 2924/0665; H01L 2924/351; H01L 21/56; H01L 2924/3511;
(Continued)

(56) References Cited

U.S. PATENT DOCUMENTS 6,960,825 B2 * 11/2005 Mamitsu ............... H01L 23/051
                                                       257/718
9,842,811 B1 * 12/2017 Chou ................. H01L 23/3736
(Continued)

FOREIGN PATENT DOCUMENTS

JP   H06-224245 A   8/1994
JP   2000-077603 A  3/2000
(Continued)

OTHER PUBLICATIONS

Office Action issued for counterpart Japanese Application No. 2016-205901, issued by the Japan Patent Office dated Aug. 4, 2020 (drafted on Jul. 30, 2020).
(Continued)

*Primary Examiner* — Jesse Y Miyoshi

(57) ABSTRACT

A semiconductor apparatus 1 includes a circuit substrate 3 having a circuit pattern layer 3*c* on an upper principal surface, semiconductor elements 4*a* and 4*b* mounted on the circuit pattern layer 3*c* of the circuit substrate 3, a printed substrate 6 arranged apart from the circuit substrate 3 on the upper principal surface side of the circuit substrate 3, a housing 2 mold-sealing the upper principal surface side of the circuit substrate 3, and a block 10 provided sandwiching at least part of the housing 2 and being opposite to the circuit substrate 3, the block having a linear expansion coefficient smaller than that of the housing 2.

12 Claims, 16 Drawing Sheets

(51) Int. Cl.
*H01L 23/16* (2006.01)
*H01L 21/56* (2006.01)
*H01L 23/373* (2006.01)
*H01L 23/498* (2006.01)
*H01L 25/07* (2006.01)
*H01L 25/00* (2006.01)
*H01L 25/16* (2006.01)
*H01L 25/18* (2006.01)
*H01L 23/24* (2006.01)
*H01L 23/00* (2006.01)
*H01L 21/48* (2006.01)
*H01L 23/053* (2006.01)
*H01L 23/10* (2006.01)

(52) U.S. Cl.
CPC ............ *H01L 23/053* (2013.01); *H01L 23/10* (2013.01); *H01L 23/16* (2013.01); *H01L 23/24* (2013.01); *H01L 23/315* (2013.01); *H01L 23/3142* (2013.01); *H01L 23/3735* (2013.01); *H01L 23/49833* (2013.01); *H01L 23/49838* (2013.01); *H01L 23/5385* (2013.01); *H01L 23/562* (2013.01); *H01L 25/072* (2013.01); *H01L 25/50* (2013.01); *H01L 23/49811* (2013.01); *H01L 25/162* (2013.01); *H01L 25/18* (2013.01); *H01L 2224/32225* (2013.01)

(58) Field of Classification Search
CPC ......... H01L 21/565; H01L 23/28–3192; H01L 23/49562; H01L 23/3107; H01L 23/3121; H01L 23/315; H01L 23/3135
See application file for complete search history.

(56) References Cited

U.S. PATENT DOCUMENTS

| | | | |
|---|---|---|---|
| 2004/0036172 A1* | 2/2004 | Azuma | H01L 23/3128 257/738 |
| 2007/0267739 A1 | 11/2007 | Kajiwara | |
| 2008/0042302 A1 | 2/2008 | Crispell | |
| 2009/0302444 A1* | 12/2009 | Ueda | H01L 25/18 257/675 |
| 2010/0007026 A1* | 1/2010 | Shikano | H01L 24/49 257/773 |
| 2010/0109151 A1 | 5/2010 | Fujimura et al. | |
| 2012/0086003 A1* | 4/2012 | Park | H01L 23/13 257/48 |
| 2014/0355219 A1 | 12/2014 | Tada | |
| 2015/0223339 A1 | 8/2015 | Nakamura et al. | |

FOREIGN PATENT DOCUMENTS

| | | |
|---|---|---|
| JP | 2003243598 A | 8/2003 |
| JP | 2007311441 A | 11/2007 |
| JP | 2008047920 A | 2/2008 |
| JP | 2009-064852 A | 3/2009 |
| JP | 2011243624 A | 12/2011 |
| JP | 2013065598 A | 4/2013 |
| JP | 2013-172044 A | 9/2013 |
| JP | 2014-183302 A | 9/2014 |
| JP | 2014236150 A | 12/2014 |
| WO | 2008/120705 A1 | 10/2008 |
| WO | 2014/061211 A1 | 4/2014 |

OTHER PUBLICATIONS

Office Action issued for counterpart Japanese Application No. 2016-150949, issued by the Japan Patent Office dated Aug. 4, 2020 (drafted on Jul. 30, 2020).

* cited by examiner

SEMICONDUCTOR APPARATUS AND MANUFACTURING METHOD OF SEMICONDUCTOR APPARATUS

The contents of the following Japanese patent application are incorporated herein by reference:
NO. 2016-205901 filed in JP on Oct. 20, 2016.

BACKGROUND

1. Technical Field

The present invention relates to a semiconductor apparatus and a manufacturing method of the semiconductor apparatus.

2. Related Art

A power semiconductor apparatus (simply referred to as a semiconductor apparatus) is configured by mounting, on a principal surface of a circuit substrate made of ceramics on which conductor foils such as copper (Cu) and aluminum (Al), for example, provided on both surfaces, a semiconductor element such as an insulated gate bipolar transistor (IGBT) and a metal oxide semiconductor field effect transistor (MOSFET), providing a printed substrate thereon and electrically connecting a surface electrode of the semiconductor element to a circuit pattern formed in the conductor foils of the principal surface by a conductive post inserted into the printed substrate and also standing an external terminal on the circuit pattern, mold-sealing the circuit substrate within a hard housing with an insulating resin such as epoxy resin and also extracting the electrode from the housing by protruding a tip of the external terminal, and exposing the other surface of the circuit substrate from the housing (for example, refer to Patent Document 1).

In the semiconductor apparatus, the circuit substrate is mold-sealed with the insulating resin, and as the housing molded according to the above is cooled to an ordinary temperature, the housing may be warped in a convex shape on the other surface side of the circuit substrate. Here, in Patent Document 2, for example, a semiconductor apparatus has been disclosed, where a semiconductor element and an aluminum wire are covered by a first resin, a second resin having characteristics different from those of the first resin is provided on the first resin, and a layer mixed by both the resins is provided between the first and second resins. Also, in Patent Document 3, a semiconductor apparatus has been disclosed, where the semiconductor apparatus is doubly transfer-molded. Also, in Patent Document 4, a semiconductor apparatus has been disclosed, where a warp suppressing layer is formed on a surface on an opposite side to a circuit substrate of a semiconductor element with respect to the semiconductor element which is flip packaged on the circuit substrate, and a stress relaxation layer is formed between the semiconductor element and the warp suppressing layer. Also, in Patent Document 5, a semiconductor apparatus has been disclosed, where the entire apparatus is covered by thermoplastic insulating resin having a high humidity resistance. Also, in Patent Document 6, a semiconductor apparatus has been disclosed, where a first member and a second member are respectively arranged on a front surface and a back surface of a ceramic substrate, and linear thermal expansion coefficients of the first member and the second member are adjusted so that each generated stress of the first member and the second member is balanced.

[Patent Document 1] PCT International Publication No. WO2014/061211
[Patent Document 2] Japanese Patent Application Publication No. 2014-183302
[Patent Document 3] Japanese Patent Application Publication No. H6-224245
[Patent Document 4] PCT International Publication No. WO2008/120705
[Patent Document 5] Japanese Patent Application Publication No. 2000-77603
[Patent Document 6] Japanese Patent Application Publication No. 2013-172044

However, there are concerns that if the semiconductor apparatus is configured in a large rated capacity of 200 A to 400 A, for example, the apparatus becomes to be in large size and accordingly, a warp of the housing becomes further large, and when implementing the semiconductor apparatus, a crack of the housing may be generated or a pump-out may occur in some cases.

SUMMARY

In a first aspect of the present invention, a semiconductor apparatus is provided, including a first circuit substrate which has a circuit pattern layer on a first surface, a semiconductor element which is mounted on the circuit pattern layer of the first circuit substrate, a sealing member which mold-seals the first surface side of the first circuit substrate, and a block which is provided sandwiching at least part of the sealing member and being opposite to the first circuit substrate, the block having a linear expansion coefficient smaller than that of the sealing member.

In second aspect of the present invention, a semiconductor apparatus is provided, including a first circuit substrate which has a circuit pattern layer on a first surface, a semiconductor element which is mounted in the circuit pattern layer of the first circuit substrate, a sealing member which mold-seals the first surface side of the first circuit substrate, the sealing member having a recess in a surface on an opposite side to the first circuit substrate, and a block which is provided sandwiching at least part of the sealing member and being opposite to the first circuit substrate, the block fitted into the recess of the sealing member.

In a third aspect of the present invention, a manufacturing method of a semiconductor apparatus is provided, including a mounting step of mounting a semiconductor element on a circuit pattern layer of a first circuit substrate having the circuit pattern layer on a first surface, an arrangement step of arranging, within a mold, a block to be provided in a position opposite to the first circuit substrate and the first circuit substrate on which the semiconductor element is mounted, and a sealing step of mold-sealing a space within the mold by injecting a molding material in the mold, the space including a space between the first surface side of the first circuit substrate and the block.

In a fourth aspect of the present invention, a manufacturing method of a semiconductor apparatus is provided, including a mounting step of mounting a semiconductor element on a circuit pattern layer of a first circuit substrate having the circuit pattern layer on a first surface, an arrangement step of arranging, within a mold having a protruding portion in a position opposite to the first circuit substrate, the first circuit substrate on which the semiconductor element is mounted, a sealing step of mold-sealing a space within the mold by injecting a molding material in the mold to form a sealing member having a recess in a surface on an opposite side to the first circuit substrate, the space including the first surface side of the first circuit substrate, and a fitting step of fitting a block into the recess of the sealing member.

Note that the summary clause does not necessarily describe all necessary features of the embodiments of the present invention. Also, the present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1A:
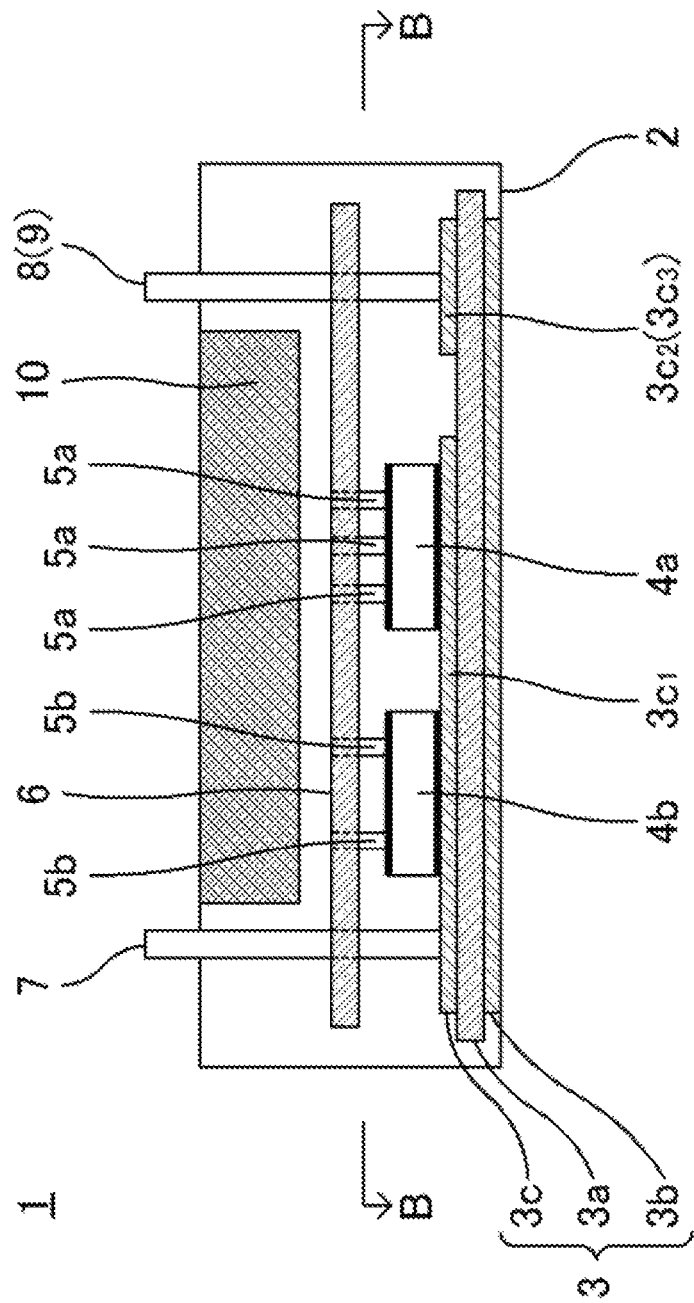
FIG. 1A shows a cross-sectional configuration in a side view of a semiconductor apparatus according to the present embodiment.
Figure 1B:
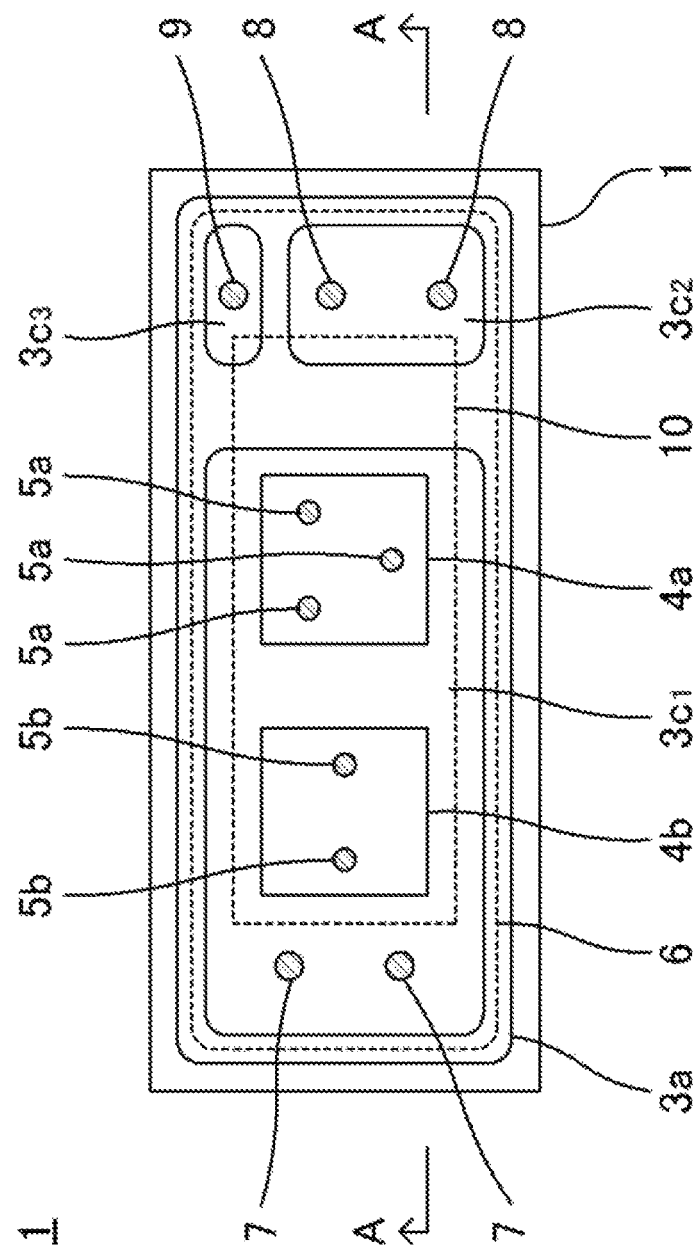
FIG. 1B shows a cross-sectional configuration in a top view of the semiconductor apparatus according to the present embodiment.

FIG. 1A and FIG. 1B show a configuration of a semiconductor apparatus 1 according to the present embodiment. Here, FIG. 1A shows a cross-sectional configuration of the semiconductor apparatus 1 along a reference line AA in FIG. 1B, and FIG. 1B shows a cross-sectional configuration of the semiconductor apparatus 1 along a reference line BB in FIG. 1A. Note that it is assumed that a perpendicular direction to paper surface in FIG. 1A and an up-and-down direction in FIG. 1B are a vertical direction, a crosswise direction in FIG. 1A and FIG. 1B is a lateral direction, and an up-and-down direction in FIG. 1A and a perpendicular direction to paper surface in FIG. 1B are a height direction. The semiconductor apparatus 1 is to suppress a warp of a housing sealing a circuit substrate, and includes a housing (sealing member) 2, a circuit substrate (first circuit substrate) 3, semiconductor elements 4a and 4b, conductive posts (first conductive posts) 5a and 5b, a printed substrate (second circuit substrate) 6, external terminals (first and second conductive posts) 7 to 9, and a block 10.

Note that in the present specification, unless otherwise stated, the term "connect" (connected) is intended to mean conductively electrically connecting, and also includes a case where another electronic component is provided therebetween.

The housing (one example of the sealing member) 2 is a member to mold-seal each component of the semiconductor apparatus 1 arranged on an upper principal surface (simply referred to as a principal surface) side of a circuit substrate 3, that is, on the substrate, within the housing; however, upper ends of the external terminals 7 to 9 are protruded upward and a lower principal surface (referred to as a lower surface) of the circuit substrate 3 is exposed on the same plane as a bottom surface of the housing 2. The housing 2 is molded in a rectangular shape by molding with thermosetting resin such as epoxy resin, for example.

The circuit substrate (one example of the first circuit substrate) 3 is a substrate to mount thereon the semiconductor elements 4a and 4b, and a DCB (Direct Copper Bonding) substrate, an AMB (Active Metal Brazing) substrate, and the like may be adopted, for example. The circuit substrate 3 includes an insulating plate 3a, a metal layer 3b, and a circuit pattern layer 3c. The insulating plate 3a is a plate member configured with insulation ceramics, such as aluminum nitride, silicon nitride, and aluminum oxide, for example, in a thickness of 0.2 mm to 1 mm, for example. The metal layer 3b is provided on a lower surface of the insulating plate 3a by using conductive metal, such as copper and aluminum, in a film thickness of 0.1 mm to 1 mm, for example. Note that for rust prevention and the like, a plating process may be performed on a surface of the metal layer 3b by using nickel or the like. The circuit pattern layer 3c is provided on a principal surface of the insulating plate 3a by using conductive metal, such as copper and aluminum, similar to the metal layer 3b.

The circuit pattern layer 3c of the circuit substrate 3 has three circuit patterns $3c_1$, $3c_2$, and $3c_3$. The circuit pattern $3c_1$ is arranged within a region of approximately two thirds of the left side of the drawing on the insulating plate 3a. The semiconductor elements 4a and 4b are mounted on the circuit pattern $3c_1$. The circuit patterns $3c_2$ and $3c_3$ are arranged side by side within a region of approximately one third of the right side of the drawing on the insulating plate 3a.

The semiconductor element 4a is a switching element made of a compound semiconductor such as SiC, for example, and a vertical metal oxide semiconductor field effect transistor (MOSFET), an insulated gate bipolar transistor (IGBT), and the like which have an electrode respectively on a front surface and a back surface may be adopted. If the semiconductor element 4a is an IGBT (or MOSFET), the semiconductor element 4a has an emitter electrode (or a source electrode) and a gate electrode (collectively referred to as surface electrodes) in the front surface and a collector electrode (or a drain electrode) in the back surface (any of them are not shown). The semiconductor element 4a is joint to the principal surface of the circuit substrate 3 on the back surface by being mounted on the circuit pattern $3c_1$ of the circuit pattern layer 3c by a joining material (not shown)

such as a solder. Note that in the present embodiment, as one example, IGBT is used as the semiconductor element 4a.

The semiconductor element 4b is a rectifying element made of a compound semiconductor such as SiC, for example, and, as one example, a vertical free-wheel diode (FWD), schottky barrier diode (SBD), and the like which have an electrode respectively on a front surface and a back surface may be adopted. The semiconductor element 4b has an anode electrode on the front surface and a cathode electrode on the back surface. The semiconductor element 4b is joint with the principal surface of the circuit substrate 3 on the back surface by mounting the back surface on the circuit pattern $3c_1$ of the circuit pattern layer 3c by a joining material (not shown) such as a solder. Accordingly, the cathode electrode of the semiconductor element 4b is connected to the collector electrode of the semiconductor element 4a.

The conductive posts 5a and 5b (one example of first conductive posts) are conductive members which connect at least one of the circuit pattern layer 3c and the surface electrodes of the semiconductor elements 4a and 4b on the circuit substrate 3 to a circuit pattern layer (not shown) of the printed substrate 6 so as to conduct therebetween, and are molded in a pillar shape such as a column by using conductive metal such as copper and aluminum, as one example. Note that by connecting the lower ends to the semiconductor elements 4a and 4b by a joining material (not shown) such as a solder, the conductive posts 5a and 5b are arranged standing on the surface electrodes thereof and the upper ends are connected to the circuit pattern layer of the printed substrate 6 by soldering, brazing, or caulking.

The conductive posts 5a and 5b respectively include a plurality of posts. The conductive post 5a includes three posts, as one example. Two posts among them are arranged standing on the emitter electrode of the semiconductor element 4a and are connected to the circuit pattern layer of the printed substrate 6. The left one post is arranged standing on the gate electrode of the semiconductor element 4a and is connected to the circuit pattern layer of the printed substrate 6. The conductive post 5b includes two posts, as one example. These two posts are arranged standing on the anode electrode of the semiconductor element 4b and is connected to the circuit pattern layer of the printed substrate 6.

The printed substrate (one example of second circuit substrate) 6 is a substrate in which circuit patterns connecting the electrodes of the semiconductor elements 4a and 4b to the external terminals 7 to 9 are provided, and is arranged apart from the circuit substrate 3 on the principal surface side of the circuit substrate 3. The printed substrate 6 has an insulating plate and a circuit pattern layer forming circuit patterns on the principal surface or lower surface (any of them are not shown). For the insulating plate, a rigid substrate configured with glass epoxy material and the like or a flexible substrate configured with polyimide material and the like may be adopted, for example. A plurality of through holes (not shown), through which the conductive posts 5a, 5b, and the external terminals 7 to 9 are inserted, are provided in the printed substrate 6. The circuit pattern layer is provided on the surface of the insulating plate by using conductive metal such as copper and aluminum.

The external terminals (one example of the first and second conductive posts) 7, 8, and 9 are respectively input/output terminals to input/output currents output from the semiconductor element 4a to the outside of the semiconductor apparatus 1 and a control terminal to input a control signal from the outside of the semiconductor apparatus 1 to the semiconductor element 4a. Similar to the conductive posts 5a and 5b, the external terminals 7 to 9 are molded in a pillar shape such as a column by using conductive metal such as copper and aluminum. The external terminal 7 is connected to the circuit pattern $3c_1$ of the circuit pattern layer 3c on one end, and, via this, connected to the collector electrode of the semiconductor element 4a and the cathode electrode of the semiconductor element 4b. The external terminal 8 is connected to the circuit pattern $3c_2$ of the circuit pattern layer 3c on one end, and is connected to the emitter electrode of the semiconductor element 4a and the anode electrode of the semiconductor element 4b via the circuit pattern $3c_2$, the printed substrate 6, and the conductive posts 5a and 5b. The external terminal 9 is connected to the circuit pattern $3c_3$ of the circuit pattern layer 3c on one end, and is connected to the gate electrode of the semiconductor element 4a via the circuit pattern $3c_3$, the printed substrate 6, and the conductive post 5a. The external terminals 7 to 9 are arranged standing on the circuit pattern $3c_1$ to $3c_3$ by a joining material (not shown) such as a solder, and a tip of each of the external terminals 7 to 9 protrudes upward from a surface on the opposite side to the circuit substrate 3, that is, the upper surface of the housing 2, via a through hole (not shown) of the printed substrate 6.

The block 10 is a member for suppressing a warp of the housing 2, and has a smaller linear expansion coefficient than that of the housing 2. The block 10 may be formed from a material such as polyphenylene sulfide resin (PPS), for example, since the block 10 desirably has an insulation because it is provided within the housing 2 which seals and insulates the semiconductor elements 4a and 4b, desirably has a toughness because it receives a stress resulted from the warp of the housing 2, and also desirably has a heat resistance because it receives heat while being molded. The size (including a volume ratio to the housing 2) and the shape of the block 10 may be appropriately determined according to the warp of the housing 2 and the arrangement within the housing. In the present embodiment, as one example, the block 10 is molded in a cubic shape having a lateral direction taken as a longitudinal direction.

Note that the block 10 may be configured with a small linear expansion coefficient by using the same material as that of the housing 2, but changing a content of filler such as aluminum oxide and silicon dioxide, or also may be formed by spraying ceramics or the like having a small linear expansion coefficient.

The block 10 is provided above the printed substrate 6, that is, opposite to the principal surface of the printed substrate 6 (and the principal surface of the circuit substrate 3) sandwiching a part of the printed substrate 6 and the housing 2, having the longitudinal direction toward the longitudinal direction (that is, the lateral direction) of the housing 2. That is, the circuit substrate 3 is provided on the bottom surface side of the housing 2, and the block 10 is provided on the upper surface side of the housing 2. Here, the block 10 is sandwiched by the housing 2 in the lateral direction. Note that it may be that at least part of both ends of the block 10 is sandwiched by the housing 2, not limited to the whole of both ends.

Note that although, in the semiconductor apparatus 1 according to the present embodiment, the electrodes of the semiconductor elements 4a, 4b are connected to the external terminals 7 to 9 by using the conductive posts 5a, 5b and the printed substrate 6, the connection may be made by wire bonding. Here, the wire is formed, for example, in a diameter of 300 μm to 500 μm with respect to a high-pressure resistant apparatus by using conductive metal, such as copper and aluminum, or conductive alloy such as iron aluminum alloy, for example. In this case, the block 10 is provided above the circuit substrate 3, that is, sandwiching a part of the housing 2 and being opposite to the principal surface of the circuit substrate 3.

According to the above-described configuration of the semiconductor apparatus 1, even if the upper surface side of the housing 2 in which the circuit substrate 3 is arranged is largely contracted relative to the bottom surface side when cooling the housing 2 which is molded by mold-sealing, with insulating resin, the mounted circuit substrate 3 on which the semiconductor elements 4a, 4b and the printed substrate 6 are mounted to an ordinary temperature, since the block 10 has a linear expansion coefficient smaller than the housing 2, a recessed warp of the housing 2 on the upper surface side is suppressed.

A manufacturing method of the semiconductor apparatus 1 will be described.

Figure 2:
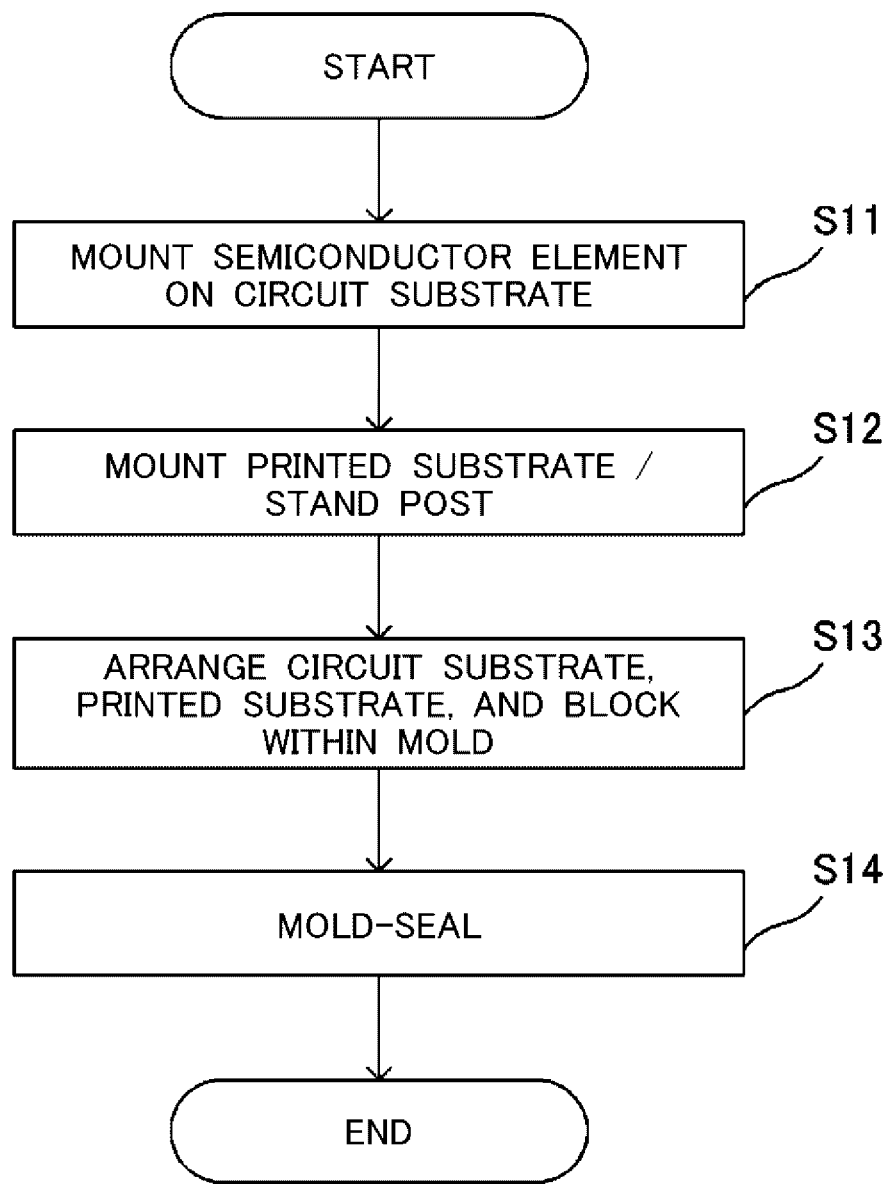
FIG. 2 shows a manufacturing flow of the semiconductor apparatus according to the present embodiment.

FIG. 2 shows a manufacturing flow of the semiconductor apparatus 1. Note that it is assumed that a plurality of the blocks 10 in arbitrary shapes and sizes are molded, independent from the present flow.

Figure 3A:
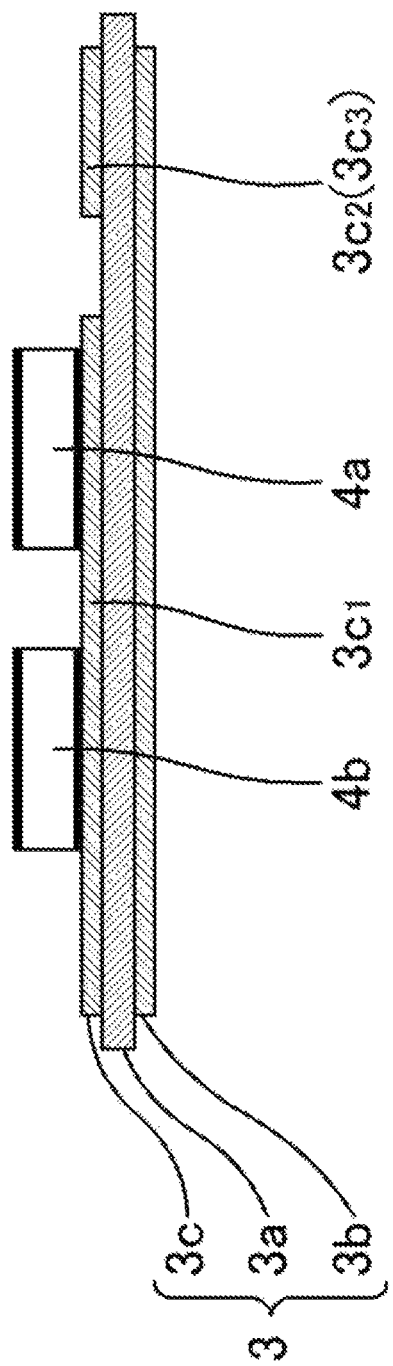
FIG. 3A shows a state that a semiconductor element is mounted on a circuit substrate according to a mounting process.

In a Step S11 (a mounting process), the semiconductor elements 4a and 4b are mounted on the principal surface of the circuit substrate 3. As shown in FIG. 3A, the semiconductor elements 4a and 4b are joined to the circuit pattern layer 3c (that is, the circuit pattern $3c_1$) of the circuit substrate 3 by the back surface electrodes (that is, the collector electrode and the cathode electrode) via a joining material (not shown) such as a solder.

Figure 3B:
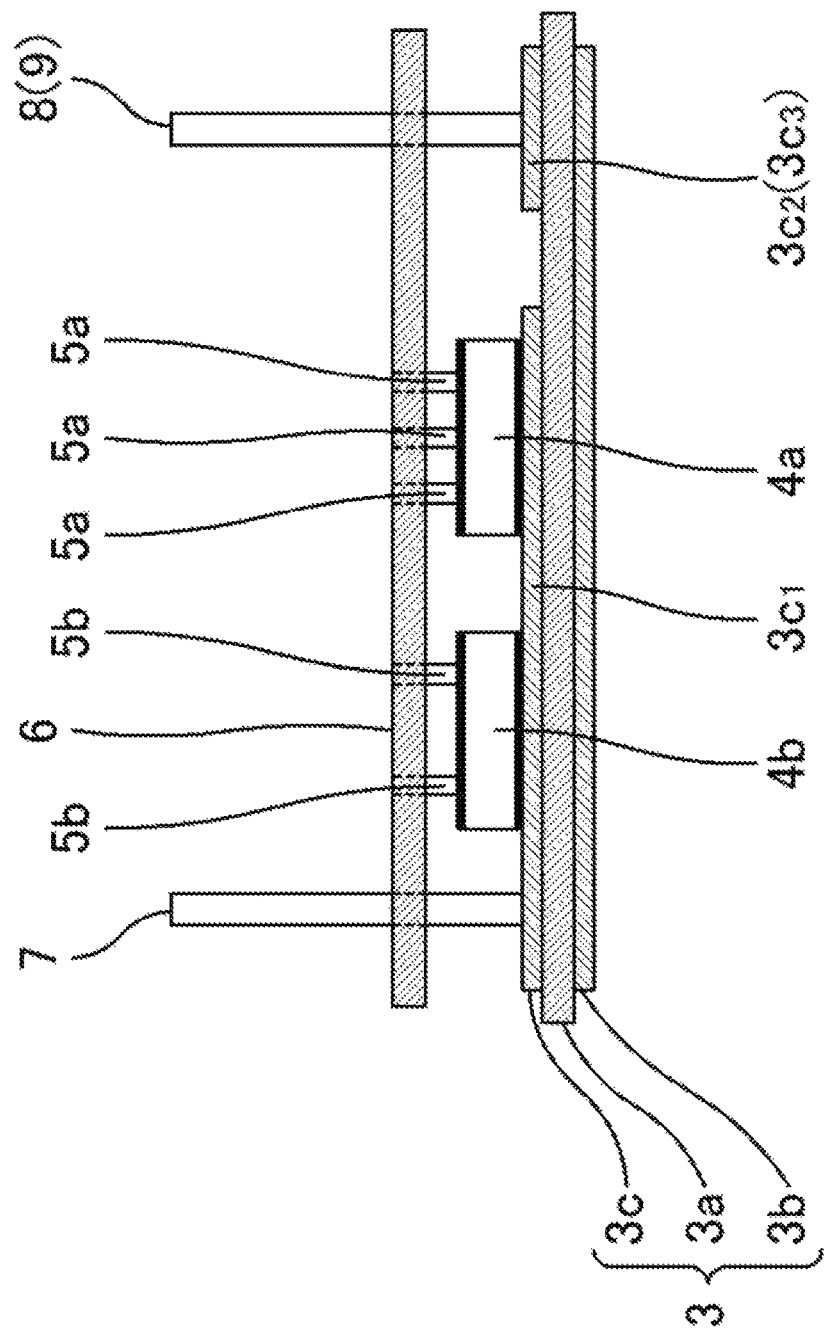
FIG. 3B shows a state that a printed substrate is mounted on the circuit substrate and a conductive post is arranged standing on a surface electrode of the semiconductor element according to a post standing process.

In a Step S12 (a standing process), the printed substrate 6 is mounted on the circuit substrate 3, and also the conductive posts 5a and 5b are respectively arranged standing on the front surface electrodes of the semiconductor elements 4a and 4b. First, the conductive posts 5a and 5b, and the external terminals 7 to 9 are inserted through a plurality of through holes (not shown) of the printed substrate 6. Next, the printed substrate 6 is supported on the circuit substrate 3. Accordingly, the conductive posts 5a and 5b are respectively arranged standing on the front surface electrodes of the semiconductor elements 4a and 4b via a joining material (not shown) such as a solder, and the external terminals 7 to 9 are respectively arranged standing on the circuit patterns $3c_1$ to $3c_3$ of the circuit pattern layer 3c via a joining material (not shown) such as a solder. Finally, by reflowing a joining material by using a reflow furnace, as shown in FIG. 3B, the semiconductor elements 4a and 4b are joint on the circuit pattern $3c_1$ of the circuit substrate 3, the lower ends of the external terminals 7 to 9 are respectively joint to the circuit patterns $3c_1$ to $3c_3$ of the circuit substrate 3, and the lower ends of the conductive posts 5a and 5b are respectively joint to the front surface electrodes of the semiconductor elements 4a and 4b.

Figure 3C:
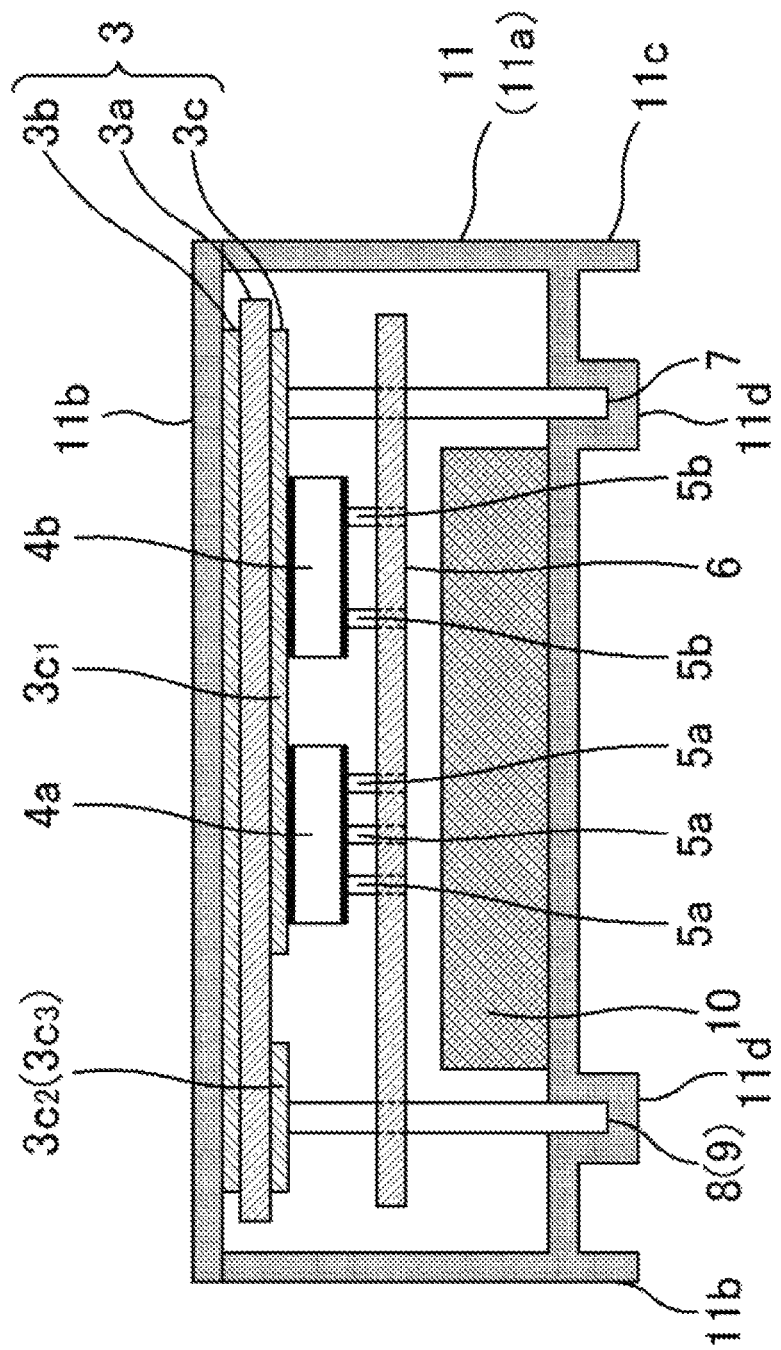
FIG. 3C shows a state that a block and the circuit substrate are arranged within a mold according to an arrangement process.

In a Step S13 (an arrangement process), the circuit substrate 3 on which the semiconductor elements 4a and 4b are mounted and the block 10 are arranged within a mold 11. As shown in FIG. 3C, the mold 11 has a box body 11a with an upper portion opened, a lid body 11b to cover the upper portion of the box body 11a, and a leg portion 11c to support the box body 11a, and a recessed portion 11d is formed to receive tips of the external terminals 7 to 9 on a bottom surface of the box body 11a. Here, the block 10 is arranged in a center of a bottom portion of the mold 11, and the circuit substrate 3 is reversed upside down and arranged in an upper portion of the mold 11. The size and shape of the block 10 are determined according to the warp of the housing 2 and the arrangement within the housing 2, and a material having a linear expansion coefficient smaller than that of the housing 2 formed by a molding material is used. Also, by inserting the tips of the external terminals 7 to 9 into the recessed portion 11d, the circuit substrate 3 and the printed substrate 6 are supported in positions opposite to the block 10 within the mold 11, and each of the vertical direction, the lateral direction, and the height direction relative to the block 10 is positioned. Note that the mold 11 may be a molded body molded by an arbitrary material such as ceramics, not limited to metal.

Figure 3D:
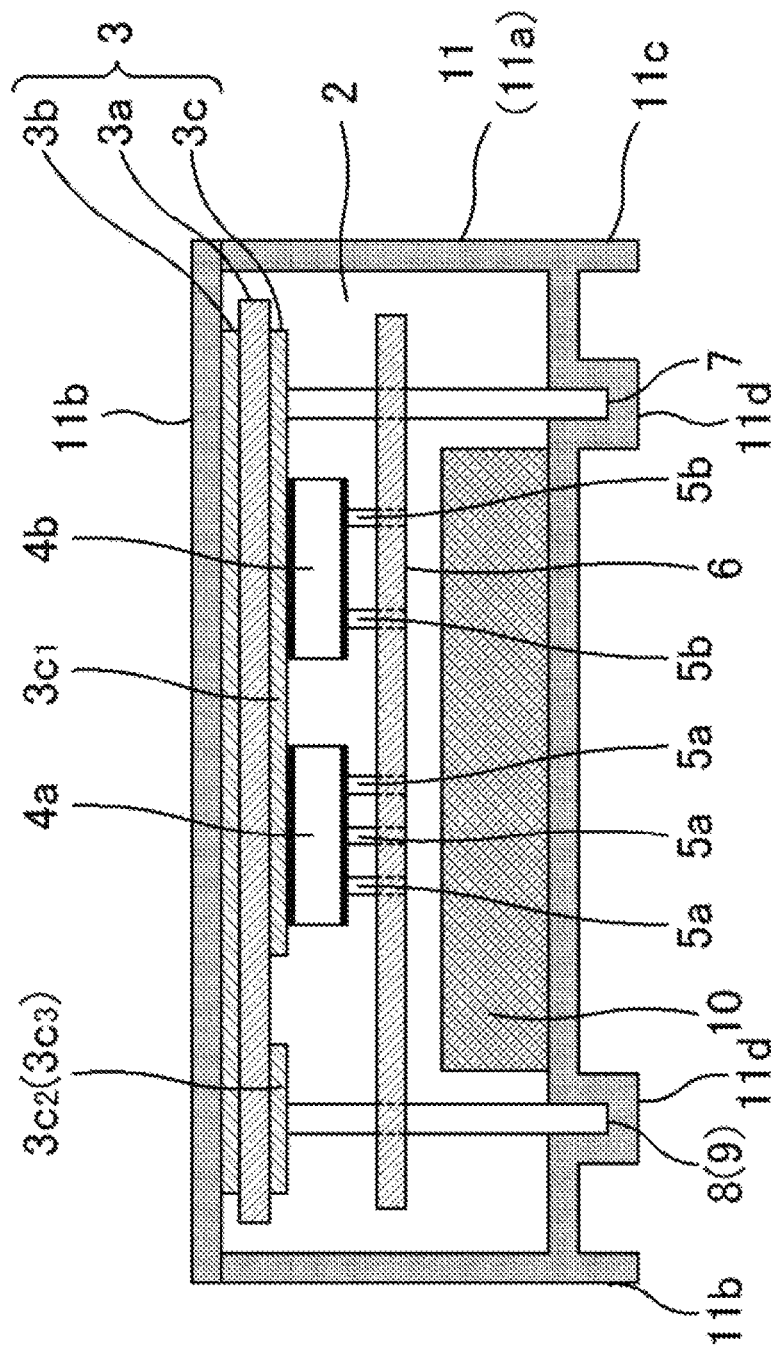
FIG. 3D shows a state that molding resin is filled in a space within the mold according to a sealing process.

In a Step S14 (a sealing process), the circuit substrate 3 on which the semiconductor elements 4a and 4b are mounted is sealed. As shown in FIG. 3D, the molding material, such as thermosetting resin, is injected in the mold 11 via a hole (not shown) provided in the box body 11a to mold-seal a space within the mold 11, the space including each space among the circuit substrate 3, the printed substrate 6, and the block 10. At this moment, by arranging the block 10 within the mold 11, a spacing distance between the printed substrate 6 and the block 10 (or a cross-sectional area of a gap thereof) relative to a spacing distance between the circuit substrate 3 and the printed substrate 6 (or a cross-sectional area of a gap thereof) is adjusted, and the molding material can uniformly flow through each gap. Here, the spacing distance between the printed substrate 6 and the block 10 (or the cross-sectional area of the gap thereof) is desirably approximately equal to the spacing distance between the circuit substrate 3 and the printed substrate 6 (or the cross-sectional area of the gap thereof). Accordingly, the circuit substrate 3, the semiconductor elements 4a and 4b, the conductive posts 5a and 5b, the printed substrate 6, and the external terminals 7 to 9 are solidly sealed within the housing 2. Finally, by taking out from the mold 11, the semiconductor apparatus 1 (refer to FIG. 1A and FIG. 1B) is configured, in which the warp of the housing 2 including the block 10 is suppressed.

Note that the Steps S13 and S14 may be performed on each of the plurality of blocks 10 having different sizes and/or shapes to manufacture plural types of semiconductor apparatuses 1 so as to sort out a semiconductor apparatus 1 with a housing 2 which has a small warp from the plural types of semiconductor apparatuses 1. Also, the block 10 may be buried on the upper side within the housing 2, not limited to be provided within the housing 2 by exposing the upper surface from the upper surface of the housing 2.

Also, in a case where the sizes and the shapes of the blocks 10 are determined uniformly and the like, the semiconductor apparatus 1 may be manufactured by providing a protruding portion having the size and shape equal to those of the block 10 in the bottom portion of the mold 11 and accordingly forming a recess (not shown) having the size and the shape equal to those of the block 10 on the surface (that is, the upper surface) of the housing 2 on the opposite side to the circuit substrate 3 to fit the block 10 into the recess.

Figure 4A:
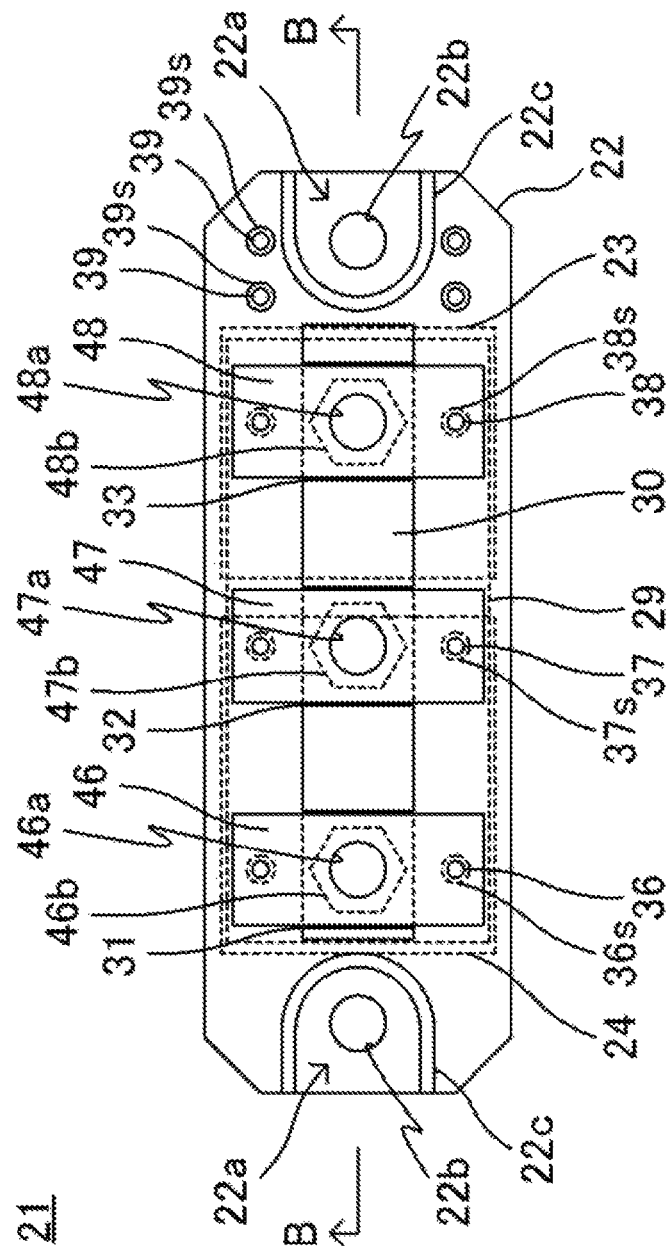
FIG. 4A shows a configuration in a top view of the semiconductor apparatus according to a modification example.
Figure 4B:
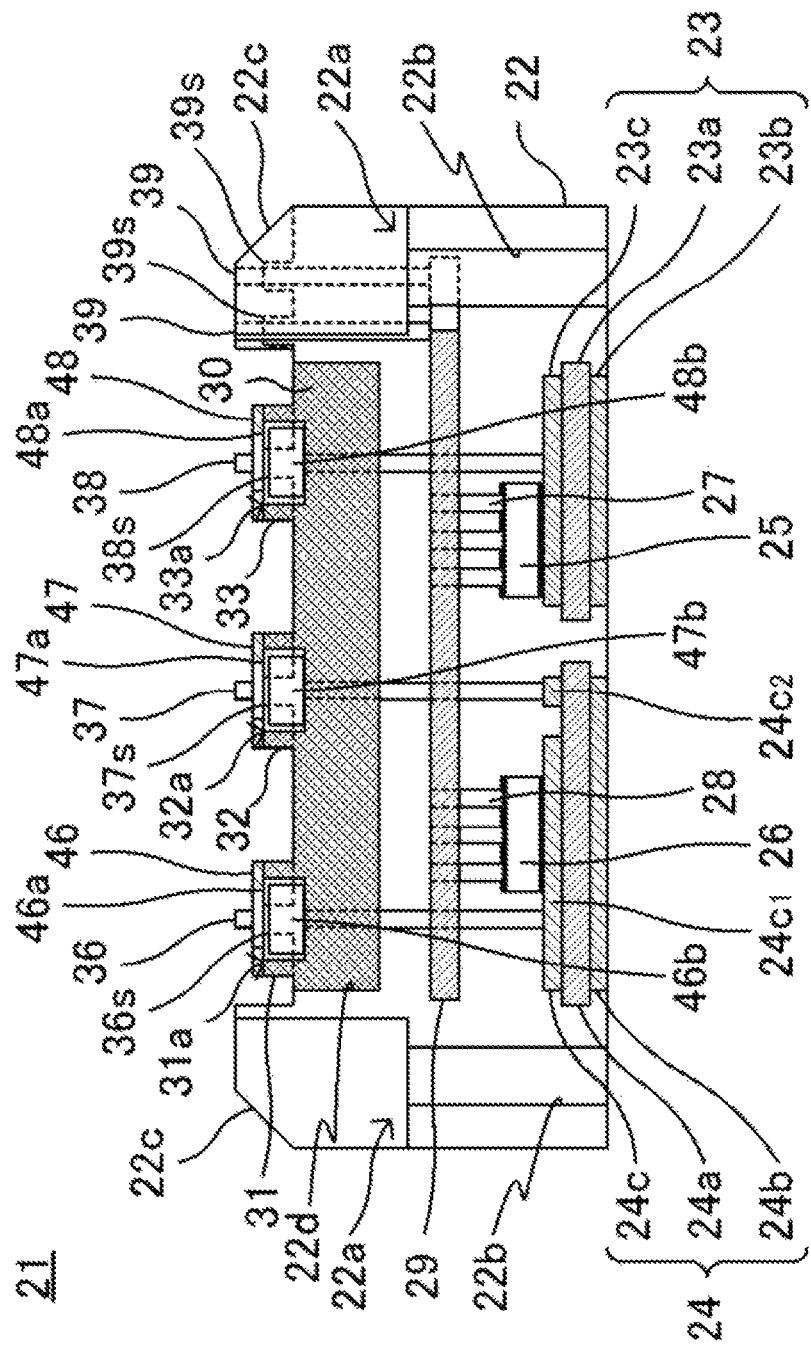
FIG. 4B shows a cross-sectional configuration in a side view of the semiconductor apparatus according to the modification example.

FIG. 4A and FIG. 4B show a configuration of a semiconductor apparatus 21 according to a modification example. Here, FIG. 4A shows a configuration of an upper surface of the semiconductor apparatus 21, and FIG. 4B shows a cross-sectional configuration of the semiconductor apparatus 21 along a reference line BB in FIG. 4A. Note that it is assumed that the up-and-down direction in FIG. 4A and the perpendicular direction to paper surface in FIG. 4B are the vertical direction, the crosswise direction in FIG. 4A and FIG. 4B is the lateral direction, and the perpendicular direction to paper surface in FIG. 4A and the up-and-down direction in FIG. 4B are the height direction. The semiconductor apparatus 21 is to suppress a warp of a housing which seals a circuit substrate, and has a housing (sealing member) 22, circuit substrates (first circuit substrates) 23 and 24, semiconductor elements 25 and 26, conductive posts (first conductive posts) 27 and 28, a printed substrate (second circuit substrate) 29, external terminals (first and second conductive posts) 36 to 38, terminal boards 46 to 48, and a block 30. Note that among each component thereof, descriptions for components corresponding to each component of the semiconductor apparatus 1 are omitted appropriately.

The housing (one example of the sealing member) 22 is a member to mold-seal the principal surface side of the circuit substrates 23 and 24, that is, each component of the semiconductor apparatus 21 supported on the circuit substrates 23 and 24, within the housing; however, the upper ends of the external terminals 36 to 38 protrude upward and the lower surfaces of the circuit substrates 23 and 24 expose on the same plane as the bottom surface of the housing 22. The housing 22 is molded in a pillar shape having an octagonal upper surface in a uniaxial direction (that is, the lateral direction) taken as the longitudinal direction by molding with the thermosetting resin such as epoxy resin, for example.

Here, a recess 22d is formed on the center of the upper surface of the housing 22, that is, the center of the surface on the opposite side to the circuit substrates 23 and 24 sealed within the housing 22 (that is, between protruding portions 36s to 38s that the external terminals 36 and 38 protrude and a stage portion 22a in which a through hole 22b is formed, which are described later), the recess 22d having a rectangular cross section in the lateral direction taken as the longitudinal direction. Note that one or more nail-shaped or plate-shaped engagement portions (not shown) jutting out from the upper surface of the housing 22 toward the inner side of the recess 22d may be formed. A block 30 described later is fitted into the recess 22d and the engagement portions abut on the upper surface of the block 30 and engage with the block 30, such that the block 30 can be prevented from coming off from the recess 22d.

Also, on both ends of the housing 22 in the lateral direction, a half single-center circular barrier portion 22c in a top view is provided extending upward from the upper surface, the stage portion 22a having a side surface on the same plane as the inner surface of the barrier portion 22c and an upper surface lower than the upper surface of the housing 22 is formed on the inner side, and the through hole 22b penetrating through the center of the stage portion 22a in the height direction is formed. According to the barrier portion 22c, a long insulation distance from the lower surface of the circuit substrate 3 to the external terminals 36 to 39 protruding on the upper surface of the housing 22 is obtained. Also, by inserting a fixing tool such as a bolt into the through hole 22b from above, the circuit substrates 23 and 24 of the semiconductor apparatus 21 may be fixed to plates of an external apparatus and the like.

Also, on the upper surface of the housing 22, three cylindrical-shaped protruding portions 36s to 38s sandwich the recess 22d and are arranged side by side in the lateral direction on each of one side and the other side of the recess 22d in the vertical direction, and two cylindrical-shaped protruding portions 39s sandwich the barrier portion 22c and are arranged side by side in the lateral direction on the right side of the drawing on each of one side and the other side of the barrier portion 22c in the vertical direction. The external terminals 36 to 39 respectively protrude upward from the upper surfaces of the protruding portions 36s to 39s.

The circuit substrates (first circuit substrates) 23 and 24 are substrates on which the semiconductor elements 25 and 26 are respectively mounted, and may be configured similar to the above-mentioned circuit substrate 3. Here, the circuit substrate 23 includes an insulating plate 23a, and a metal layer 23b and a circuit pattern layer 23c which are respectively provided on a lower surface and a principal surface of the insulating plate 23a. Also, the circuit substrate 24 includes an insulating plate 24a, and a metal layer 24b and a circuit pattern layer 24c which are respectively provided on and a lower surface and a principal surface of the insulating plate 24a. The circuit pattern layer 24c has two circuit patterns $24c_1$ and $24c_2$ respectively arranged side by side on the left side and the right side of the drawing on the insulating plate 24a.

The semiconductor elements 25 and 26 are switching elements similar to the above-mentioned semiconductor element 4a. As one example of the present embodiment, IGBT is used as the semiconductor elements 25 and 26. The semiconductor elements 25 and 26 are joint with the principal surfaces of the circuit substrates 23 and 24 on the back surfaces by respectively being mounted on the circuit pattern layer 23c of the circuit substrate 23 and the circuit pattern layer 24c (circuit pattern $24c_1$) of the circuit substrate 24 by a joining material (not shown) such as a solder.

Note that, similar to the above-mentioned semiconductor apparatus 1, rectifying elements respectively connected in reversely parallel to the semiconductor elements 25 and 26 may be mounted on the circuit substrates 23 and 24.

The conductive posts 27 and 28 (one example of the first conductive posts) are the conductive members similar to the above-mentioned conductive posts 5a and 5b, and connect at least one of the circuit pattern layers 23c, 24c on the circuit substrates 23, 24 and the surface electrodes of the semiconductor elements 25, 26 to a circuit pattern layer (not shown) of the printed substrate 29 to perform a conduction therebetween. The conductive posts 27 and 28 respectively include a plurality of posts; as one example, each of the conductive posts 27 and 28 includes three posts. Two posts thereof are arranged standing on each emitter electrode of the semiconductor elements 25 and 26, and are connected to the circuit pattern layer of the printed substrate 29. The left one post is arranged standing on each gate electrode of the semiconductor elements 25 and 26, and is connected to the circuit pattern layer of the printed substrate 6.

The printed substrate (one example of the second circuit substrate) 29 is a substrate to which wirings connecting the electrodes of the semiconductor elements 25 and 26 to the external terminals 36 to 39 are provided, and is arranged spacing from the circuit substrates 23 and 24 on the principal surface side of the circuit substrates 23 and 24. Similar to the above-mentioned printed substrate 6, the printed substrate 29 has an insulating plate and circuit pattern layers (any of them are not shown), the circuit pattern layers forming the circuit patterns on a principal surface or a lower surface of the insulating board. A plurality of through holes (not shown) through which the conductive posts 27, 28 and the external terminals 36 to 39 are inserted are provided in the printed substrate 29.

The external terminals (one example of the first and second conductive posts) 36 to 38 are conductive members provided among the circuit pattern layers 23c, 24c of the circuit substrates 23, 24 and terminal boards 46 to 48 to conduct currents output from the semiconductor elements 25 and 26 thereamong, and are molded in a flat plate shape or a columnar shape by using conductive metal such as copper and aluminum, as one example.

The external terminal 36 is connected to the circuit pattern $24c_1$ of the circuit pattern layer 24c of the circuit substrate 24 on one end, extends upward via a hole (not shown) of the printed substrate 29, and protrudes from the protruding portion 36s on the upper surface of the housing 22. Accordingly, the collector electrode of the semiconductor element 26 is connected to a terminal board 46 described later via the circuit pattern $24c_1$ and the external terminal 36. Also, the emitter electrode of the semiconductor element 25 is connected to the terminal board 46 via the conductive post 27, the printed substrate 29, and the external terminal 36.

The external terminal 37 is connected to the circuit pattern $24c_2$ of the circuit pattern layer 24c of the circuit substrate 24 on one end, extends upward via the hole (not shown) of the printed substrate 29, and protrudes from the protruding portion 37s on the upper surface of the housing 22. Accordingly, the emitter electrode of the semiconductor element 26 is connected to a terminal board 47 described later via the circuit pattern $24c_2$, the printed substrate 29, the conductive post 28, and the external terminal 37.

The external terminal 38 is connected to the circuit pattern layer 23c of the circuit substrate 23 on one end, extends upward via the hole (not shown) of the printed substrate 29, and protrudes from the protruding portion 38s on the upper surface of the housing 22. Accordingly, the collector electrode of the semiconductor element 25 is connected to a terminal board 48 described later via the circuit pattern layer 23c and the external terminal 38.

The external terminal 39 is a conductive member to input a control signal from the outside of the semiconductor apparatus 21 to the semiconductor elements 25 and 26 and also to output an output signal of the semiconductor elements 25 and 26 to the outside of the semiconductor apparatus 21, and is molded in a flat plate shape or a columnar shape by using conductive metal such as copper and aluminum, as one example. The external terminal 39 includes four terminals, arranged standing on a wiring pattern layer (not shown) of the printed substrate 29 and protruding from the protruding portion 39s on the upper surface of the housing 22. Two of the four terminals are connected to the gate electrodes of the semiconductor elements 25 and 26 via the wiring pattern layer of the printed substrate 29 and the conductive posts 27, 28, and serve as gate terminals. The left two terminals are connected to temperature sensors (not shown) provided, for example, within the semiconductor elements 25 and 26 or within the housing 22, via the printed substrate 29 and the like, and serve as sensing terminals.

The terminal boards 46 to 48 are members for conducting currents output from the semiconductor elements 25 and 26 to output the currents to the outside of the semiconductor apparatus 21, and is formed deforming the member made of conductive metal, such as copper and aluminum, for example, from a plate shape to an inverted U shape in a side view. In the terminal boards 46 to 48, holes 46a to 48a are respectively formed in the centers of the upper surfaces and holes (not shown) are formed near both ends in the vertical direction. The terminal boards 46 to 48 respectively are supported on the protruding portions 36s to 38s on the upper surface of the housing 22 by inserting the external terminals 36 to 38 through the holes (not shown) near the both ends of the upper surfaces. Accordingly, the terminal boards 46 to 48 are arranged right above three protruding portions 31 to 33 of the block 30 fitted into the recess 22d, and the holes 46a to 48a are respectively communicated with female screws of nuts 46b to 48b inserted into the protruding portions 31 to 33 in the height direction. Here, by screwing bolts (not shown), as one example of a fixing tool, to the female screws of the nuts 46b to 48b through the holes 46a to 48a of the terminal boards 46 to 48 via a conductive board (not shown) for connecting another semiconductor apparatus and the like, the conductive board may be detachably connected to the terminal boards 46 to 48.

The block 30 is a member for housing the nuts 46b to 48b and also for suppressing the warp of the housing 22. The block 30 is molded in a size and shape with a linear expansion coefficient smaller than that of the housing 22, for example, in a cubic shape in the lateral direction taken as the longitudinal direction, by using the material similar to that of the above-mentioned block 10, and three protruding portions 31 to 33 are arranged side by side in the lateral direction on the upper surface. For example, nut holes 31a to 33a which are hexagonal in a top view are respectively formed on the centers of the upper surfaces of the protruding portions 31 to 33, and the nuts 46b to 48b in the same shape with the female screws toward the height direction have been respectively inserted into the nut holes 31a to 33a.

Note that a through hole penetrating in the height direction may be provided in the block 30, and, via this, the external terminals 36 to 39 which are arranged standing on the circuit substrates 23, 24 or the printed substrate 29 may protrude from the upper surface of the housing 22.

The block 30 is fitted into the recess 22d formed on the upper surface of the housing 22. Accordingly, the block 30 is provided above the printed substrate 29, that is, provided sandwiching a part of the housing 22 and being opposite to the principal surface of the printed substrate 29 (that is, the principal surfaces of the circuit substrates 23 and 24), the longitudinal direction of the block 30 being toward the longitudinal direction (that is, the lateral direction) of the housing 22. That is, the circuit substrates 23 and 24 are provided on the bottom surface side of the housing 22, and the block 30 is provided on the upper surface side of the housing 22. Note that the block 30 may be molded including a structure formed on the upper surface side of the housing 22, for example, the barrier portion 22c and the stage portion 22a provided on both ends of the housing 22 in the lateral direction.

Note that to prevent the block 30 from coming off from the recess 22d of the housing 22, an unevenness may be provided on a side surface of the block 30 (that is, a surface facing the vertical direction and the lateral direction) or a rough surface machining may be performed on the side surface to provide a fine unevenness, or an adhesive may be provided between the block 30 and the recess 22d, for example. Accordingly, the block 30 fitted into the recess 22d of the housing 22 receives a large frictional resistance or adhesive force from the side surface of the recess 22d and becomes to hardly slip off from the recess 22d. Otherwise, by mold-sealing the circuit substrates 23 and 24 including the block 30, the block 30 is integrally embedded within the housing 22 and becomes to hardly come off from the housing 22. Also, the block 30 may be molded in a frustum shape having a large bottom surface relative to an upper surface and a tapered side surface or in a stereoscopic shape having a large bottom surface relative to an upper surface, a tapered short side surface, and a long side surface vertical to the upper surface, and then the block 30 may be fitted into the recess 22d.

According to the above-described configuration of the semiconductor apparatus 21, when cooling, to the ordinary temperature, the housing 22 molded by mold-sealing the circuit substrates 23 and 24 on which the semiconductor elements 25, 26 and the printed substrate 29 are mounted with insulating resin, since the block 30 has a linear expansion coefficient smaller than that of the housing 22, even if the upper surface side of the housing 22 on which the circuit substrates 23 and 24 are arranged is largely contracted relative to the bottom surface side, a recessed warp of the housing 22 on the upper surface side is suppressed.

A manufacturing method of the semiconductor apparatus 21 according to a modification example is described as below.

Figure 5:
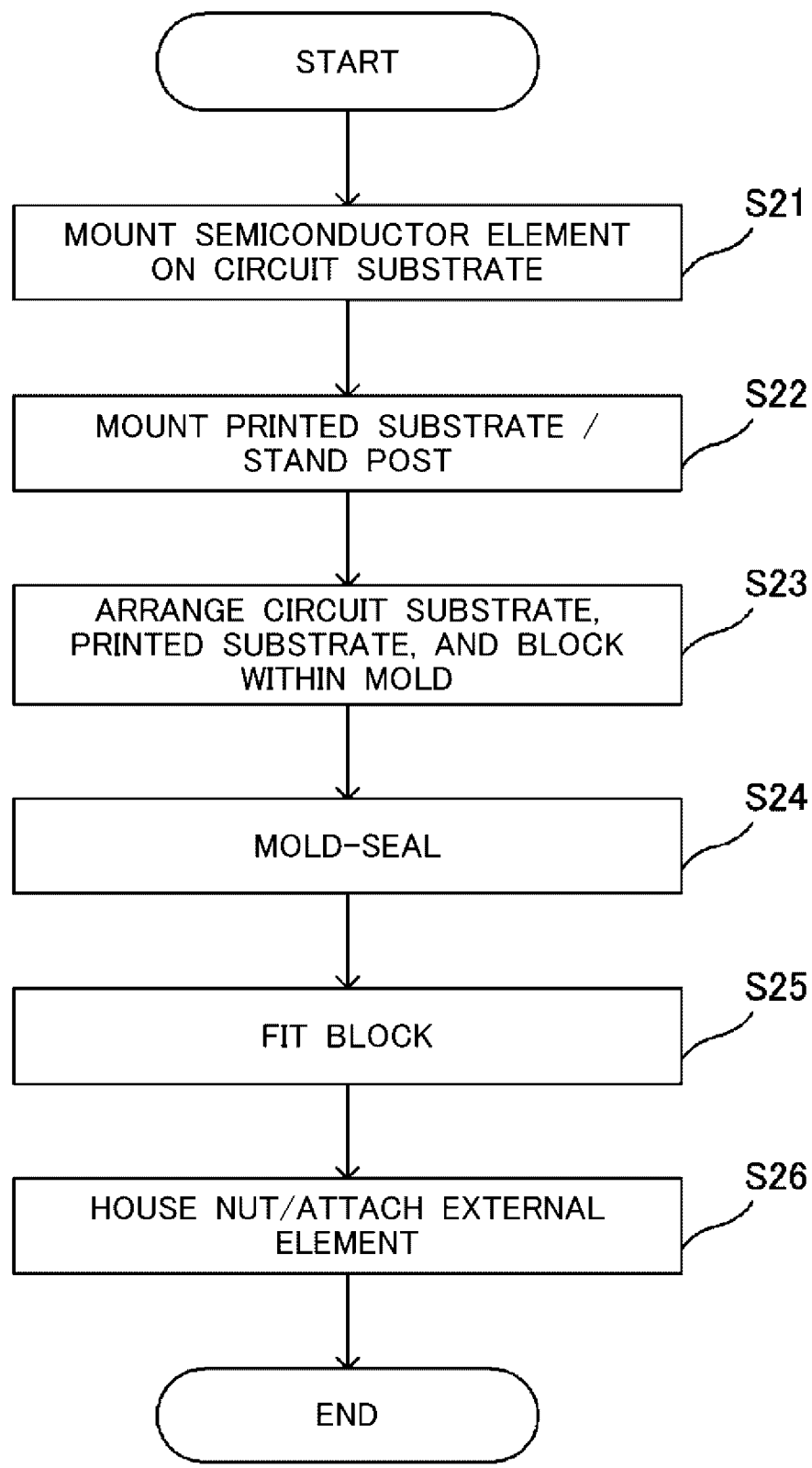
FIG. 5 shows a manufacturing flow of the semiconductor apparatus according to the modification example.

FIG. 5 shows a manufacturing flow of a semiconductor apparatus 1. Note that it is assumed that, independent from the present flow, the size and the shape of the block 30 is determined according to the warp of the housing 22 and the arrangement within the housing 22, and the block 30 having a linear expansion coefficient smaller than that of the housing 22 has been prepared.

Figure 6A:
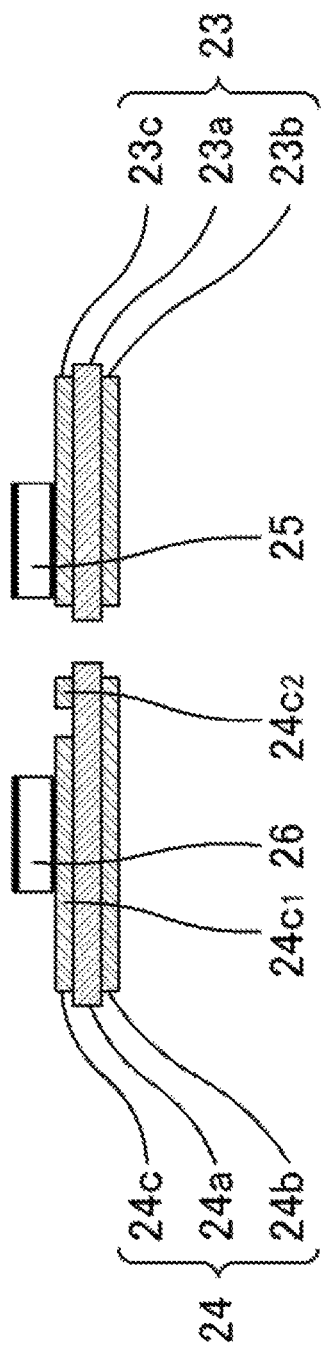
FIG. 6A shows a state that the semiconductor element is mounted on the circuit substrate according to a mounting process.

In a Step S21 (a mounting process), the semiconductor elements 25 and 26 are respectively mounted on the principal surfaces of the circuit substrates 23 and 24. As shown in FIG. 6A, the semiconductor elements 25 and 26 are joint on the circuit pattern layer 23c of the circuit substrate 23 and the circuit pattern layer 24c (circuit pattern $24c_1$) of the circuit substrate 24 by the back surface electrodes (that is, collector electrodes) via a joining material (not shown) such as a solder.

Figure 6B:
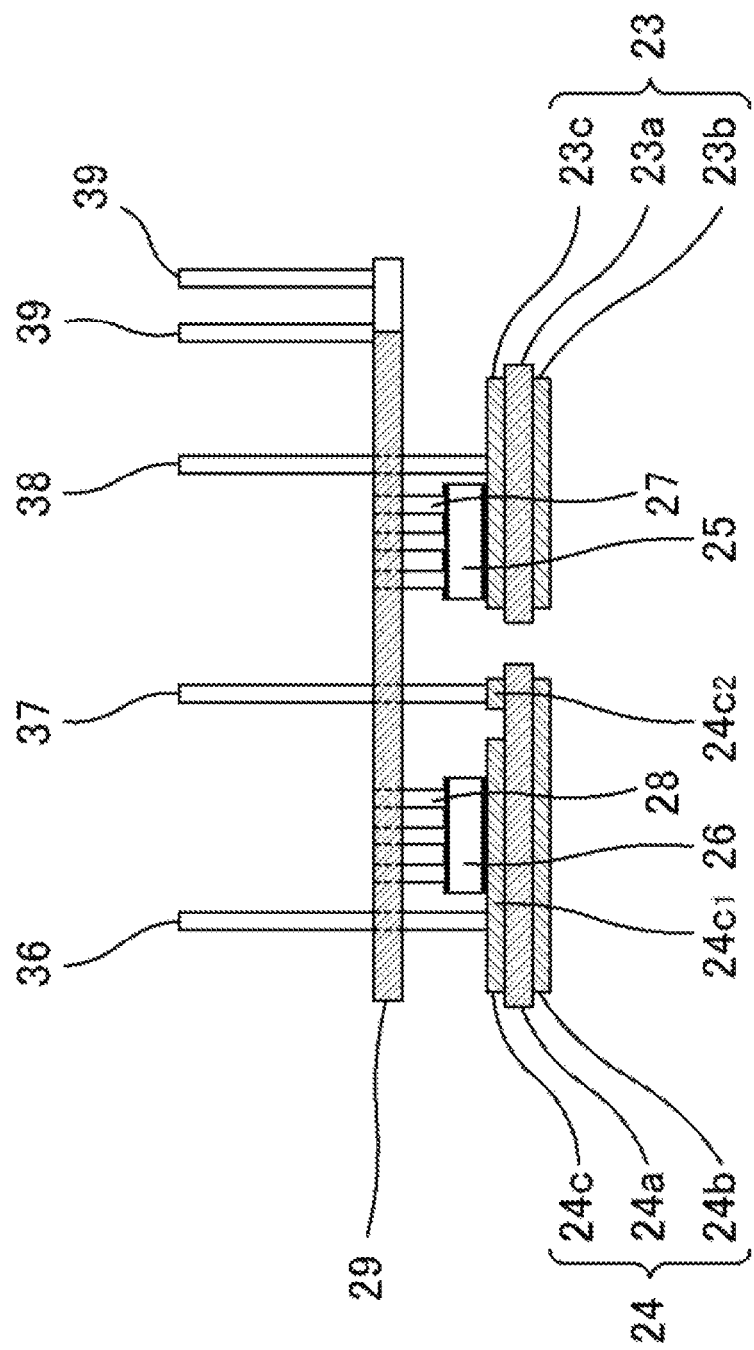
FIG. 6B shows a state that a printed substrate is mounted on the circuit substrate and a conductive post is arranged standing on a surface electrode of the semiconductor element according to a post standing process.

In a Step S22 (a standing process), the printed substrate 29 is mounted on the circuit substrates 23 and 24 and also the conductive posts 27 and 28 are respectively arranged standing on the front surface electrodes of the semiconductor elements 25 and 26. First, the conductive posts 27, 28, and the external terminals 36 to 39 are inserted through a plurality of through holes (not shown) of the printed substrate 29. Next, the circuit substrates 23 and 24 on which the semiconductor elements 25 and 26 are respectively mounted are arranged side by side, and the printed substrate 29 is supported on the circuit substrates 23 and 24. Accordingly, the conductive posts 27 and 28 are arranged standing on the front surface electrodes of the semiconductor elements 25 and 26 via a joining material (not shown) such as a solder, and the external terminals 36 to 39 are respectively arranged standing on the circuit patterns $24c_1$, $24c_2$ of the circuit pattern layer 24c of the circuit substrate 24, the circuit pattern layer 23c of the circuit substrate 23, and the circuit pattern layer (not shown) of the printed substrate 29, via a joining material (not shown) such as a solder. Finally, by reflowing the joining material by using a reflow furnace, as shown in FIG. 6B, the semiconductor elements 25 and 26 are respectively joint on the circuit pattern layers 23c and 24c of the circuit substrates 23 and 24, the lower ends of the external terminals 36 to 38 are respectively joint to the circuit patterns $24c_1$ and $24c_2$ of the circuit substrate 24 and the circuit pattern layer 23c of the circuit substrate 23, the lower ends of the conductive posts 27 and 28 are respectively joint on the front surface electrodes of the semiconductor elements 25 and 26, and the lower end of the external terminal 39 is joint to the circuit pattern layer (not shown) of the printed substrate 29.

Figure 6C:
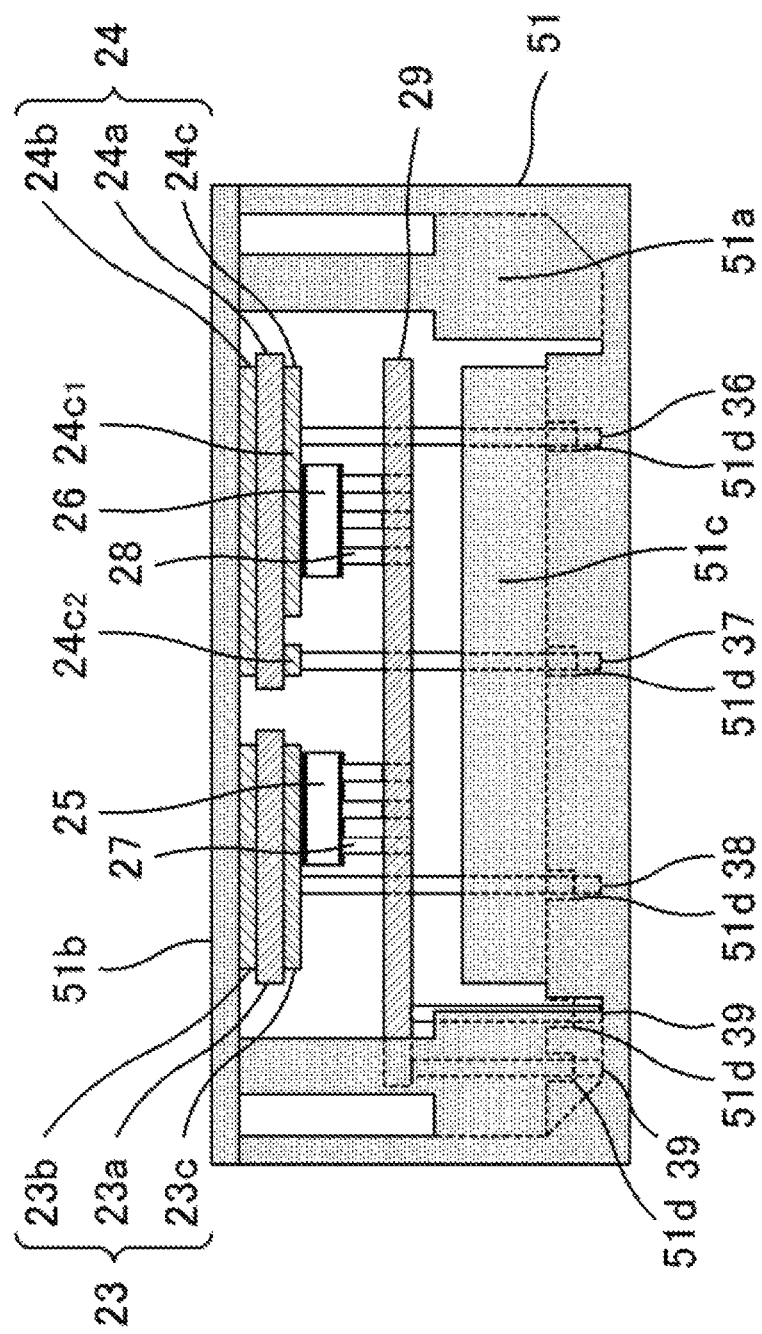
FIG. 6C shows a state that the circuit substrate is arranged within a mold according to an arrangement process.

In a Step S23 (an arrangement process), the circuit substrates 23 and 24 on which the semiconductor elements 25 and 26 are mounted are arranged within a mold 51. As shown in FIG. 6C, the mold 51 has a box body 51a with an upper portion opened and a lid body 51b to cover the upper portion of the box body 51a, and a protruding portion 51c and a recessed portion 51d are formed in a position opposite to the circuit substrates 23 and 24 arranged within the mold 51, that is, in a center of a bottom surface of the box body 51a, the protruding portion 51c having the size and shape equal to those of the block 30, the recessed portion 51d receiving the tips of the external terminals 36 to 39 on both sides in the vertical direction (the perpendicular direction to paper surface) to the protruding portion 51c. Here, by inserting the tips of the external terminals 36 to 39 into the recessed portion 51d, the circuit substrates 23, 24, and the printed substrate 29 are supported in a position opposite to the protruding portion 51c within the mold 51, and each of the lateral direction, the vertical direction, and the height direction to the protruding portion 51c is positioned. Note that the mold 51 may be a molded body molded by any material such as ceramics, not limited to metal.

Figure 6D:
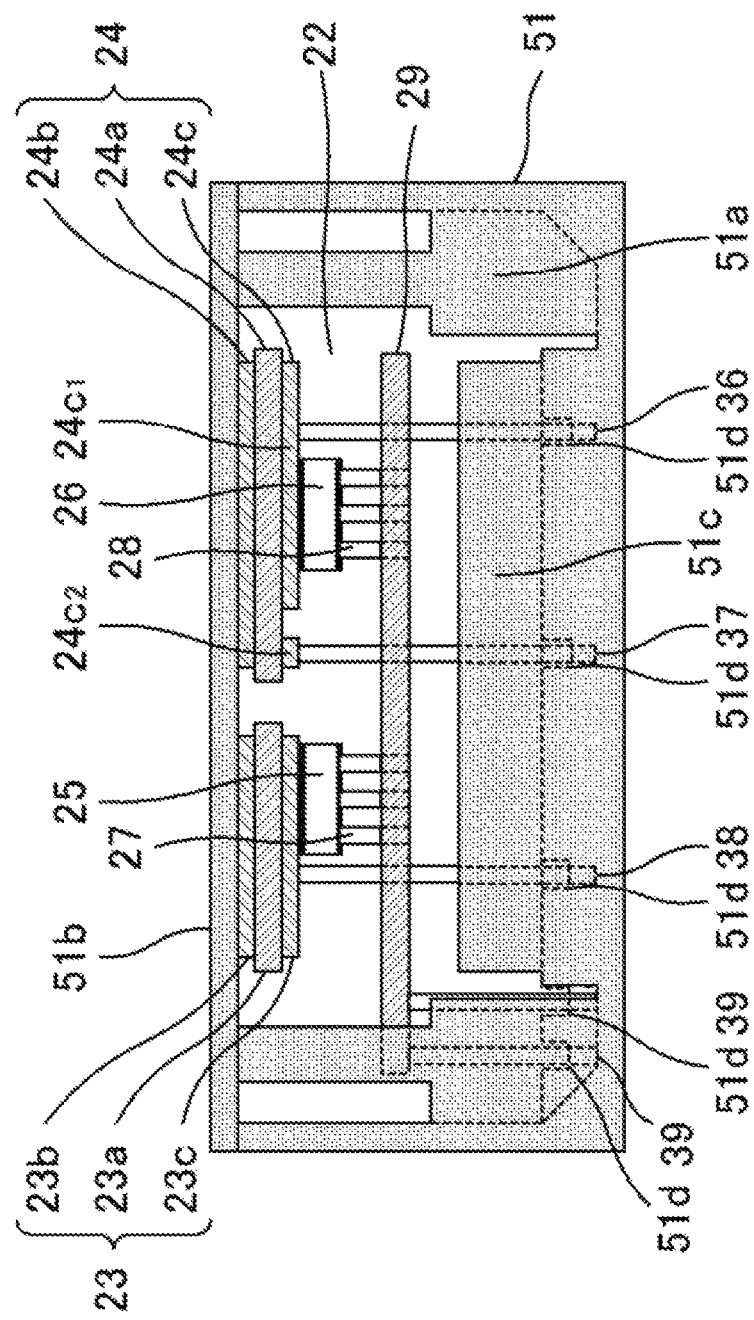
FIG. 6D shows a state that molding resin is filled in a space within the mold according to a sealing process.
Figure 6E:
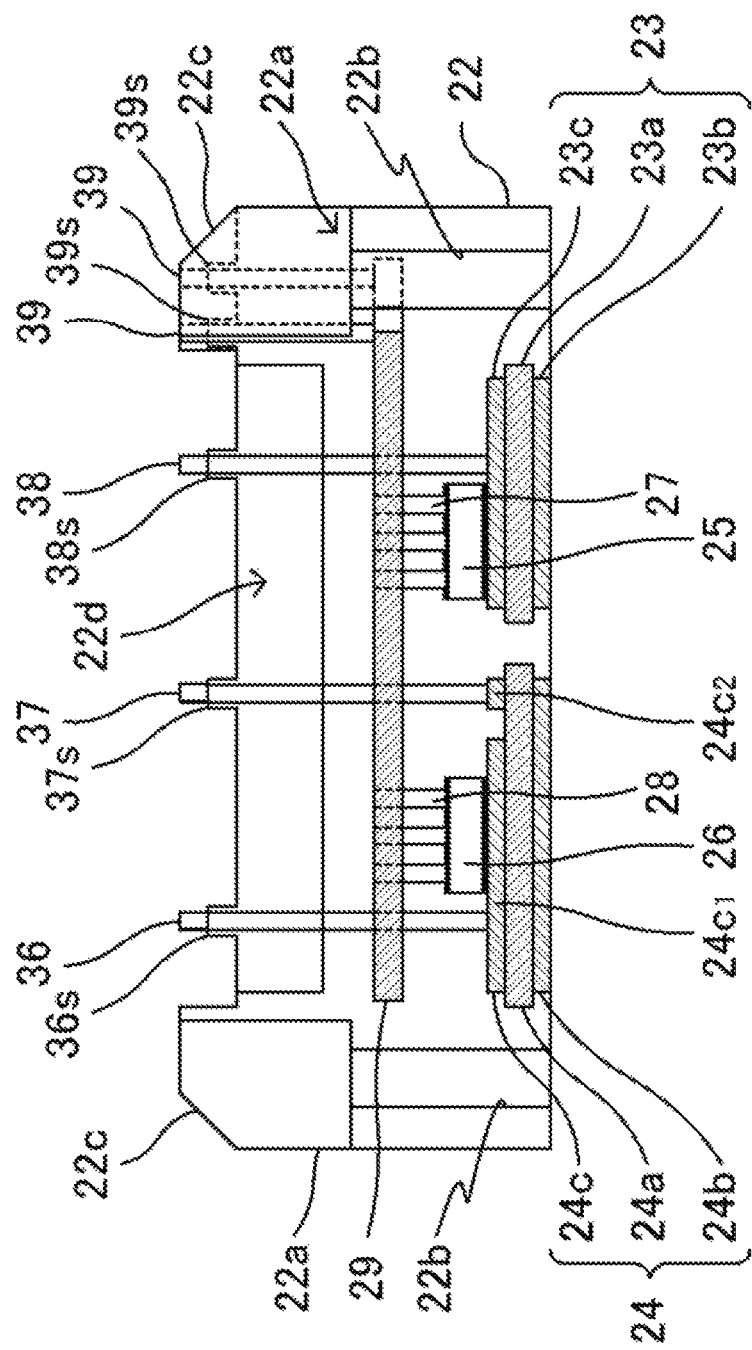
FIG. 6E shows a state that the circuit substrate is sealed.

In a Step S24 (a sealing process), the circuit substrates 23 and 24 on which the semiconductor elements 25 and 26 are respectively mounted are sealed. As shown in FIG. 6D, a molding material such as thermosetting resin is injected in the mold 51 via a hole (not shown) provided in the box body 51a to mold-seal a space within the mold 51, the space including the principal surface side of the circuit substrates 23 and 24. Accordingly, the circuit substrates 23 and 24, the semiconductor elements 25 and 26, the conductive posts 27 and 28, the printed substrate 29, and the external terminals 36 to 39 are solidly sealed within the housing 22. Finally, by taking out from the mold 51, as shown in FIG. 6E, the housing 22 having the recess 22d on the surface on the opposite side to the circuit substrates 23 and 24, that is, on the upper surface, is formed.

Figure 6F:
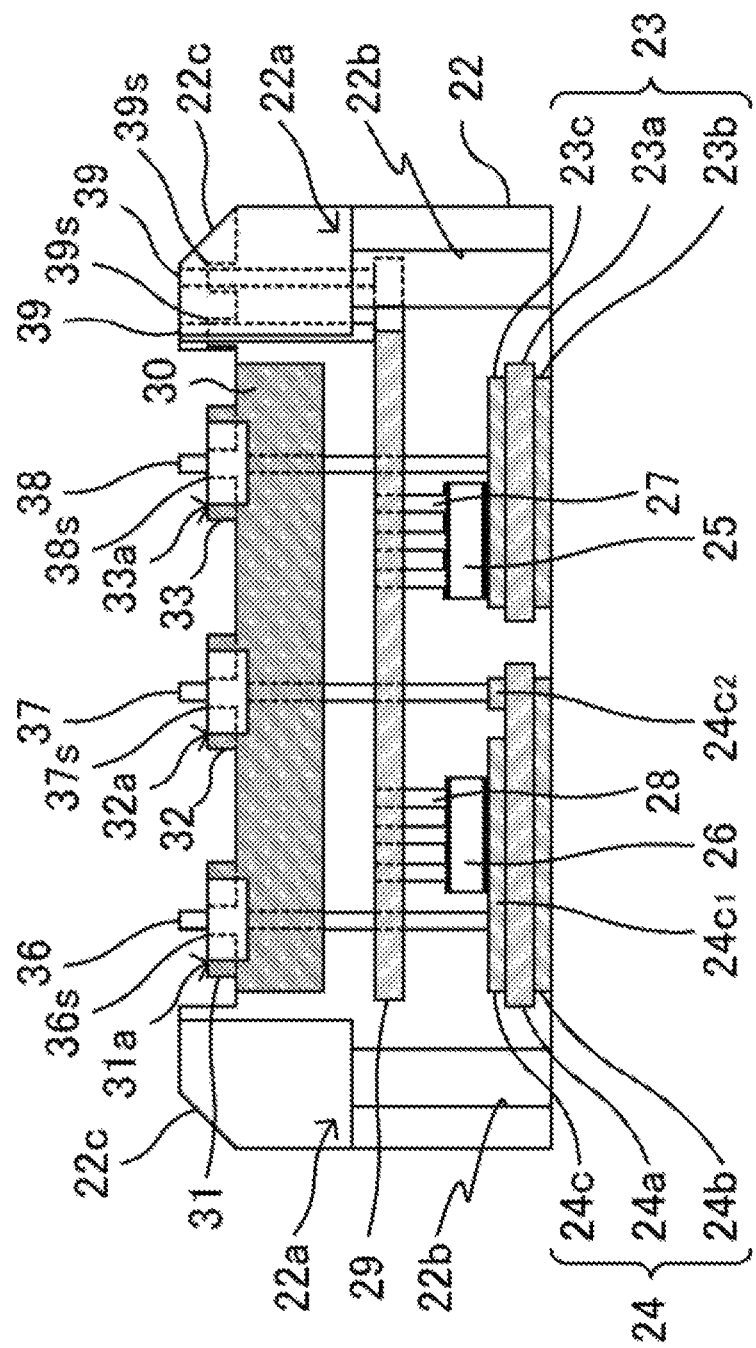
FIG. 6F shows a state that a block is fitted into a recessed portion of a housing according to a fitting process.

In a Step S25 (a fitting process), as shown in FIG. 6F, the block 30 is fitted into the recess 22d of the housing 22. Accordingly, the upper surface of the block 30 becomes to be on the same plane as the upper surface of the housing 22, and also the upper surfaces of the protruding portions 31 to 33 of the block 30 are respectively positioned in a height equal to that of the upper surfaces and the like of the protruding portions 36s to 38s of the housing 22.

In a Step S26 (an attaching process), the terminal boards 46 to 48 are attached on the housing 22. The nuts 46b to 48b are respectively inserted into the nut holes 31a to 33a formed in the protruding portions 31 to 33 of the block 30, and then the terminal boards 46 to 48 are respectively supported on the protruding portions 36s to 38s by inserting the external terminals 36 to 38 through the holes (not shown) near the both ends of the upper surfaces. Accordingly, the semiconductor apparatus 21 in which the warp of the housing 22 is suppressed is configured (refer to FIG. 4A and FIG. 4B).

Note that, similar to the above-mentioned semiconductor apparatus 1, the circuit substrates 23 and 24 on which the semiconductor elements 25 and 26 are mounted may be arranged within the mold 51, and also the block 30 may be arranged in the bottom portion of the mold 51, and the circuit substrates 23 and 24 may be mold-sealed by injecting the molding material in the mold 51 to mold the housing 22 integrally with the block 30.

Note that in the semiconductor apparatus 1 of the present embodiment and the semiconductor apparatus 21 according to the modification example, it is assumed that one block 10 or 30 is included; however, it may be assumed that a plurality of blocks are included, or a block 10 or 30 configured from a plurality of blocks is included.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

As apparent from the above-described description, according to the embodiments of the present invention, a semiconductor apparatus and a manufacturing method of the semiconductor apparatus can be achieved.

What is claimed is:

1. A semiconductor apparatus, comprising:
a first circuit substrate having a circuit pattern layer on a first surface;
a semiconductor element mounted on the circuit pattern layer of the first circuit substrate;
a sealing member to mold-seal the first-surface side of the first circuit substrate; and
a block provided sandwiching at least part of the sealing member and being opposite to the first circuit substrate, the block having a linear expansion coefficient smaller than that of the sealing member, the block being formed from an insulation material, wherein
at least part of the block is sandwiched by the sealing member in a longitudinal direction, and
the block extends across a midpoint of the sealing member in the longitudinal direction.

2. The semiconductor apparatus according to claim 1, wherein
the block has the longitudinal direction in the same direction as a longitudinal direction of the sealing member.

3. The semiconductor apparatus according to claim 1, wherein
the block is sandwiched by the sealing member in the longitudinal direction.

4. The semiconductor apparatus according to claim 2, wherein
the sealing member has a recess in a surface on an opposite side to the first circuit substrate, and
the block is fitted into the recess.

5. The semiconductor apparatus according to claim 1, wherein
the block is entirely sandwiched by the sealing member in the longitudinal direction.

6. The semiconductor apparatus according to claim 1, wherein
the first circuit substrate is provided close to a lower surface side than an upper surface side of the sealing member, and
the block is provided close to the upper surface side than the lower surface side of the sealing member.

7. The semiconductor apparatus according to claim 1, further comprising:
a second circuit substrate arranged apart from the first circuit substrate on the first-surface side of the first circuit substrate, and
the block is provided sandwiching at least part of the sealing member and being opposite to a surface on an opposite side to the first circuit substrate in the second circuit substrate.

8. The semiconductor apparatus according to claim 7, further comprising:
a second conductive post having one end which is connected to the circuit pattern layer of the first circuit substrate, and the other end which is exposed as an external terminal from a surface on an opposite side to the first circuit substrate in the sealing member.

9. The semiconductor apparatus according to claim 7, wherein
at least one of the circuit pattern layer of the first circuit substrate and an electrode of the semiconductor element is connected to a circuit pattern layer of the second circuit substrate through a first conductive post.

10. The semiconductor apparatus according to claim 1, a length of the block in the longitudinal direction is more than a half of a length of the sealing member in the longitudinal direction.

11. The semiconductor apparatus according to claim 3, wherein
the block has a nut hole for inserting a nut into the surface on the opposite side to the first circuit substrate.

12. The semiconductor apparatus according to claim 3, wherein
the sealing member has a through hole to insert a bolt thereinto for fixing the first circuit substrate side of the semiconductor apparatus to a plate, and
the block has a barrier portion which is positioned between the through hole and an external terminal exposed from the surface on the opposite side to the first circuit substrate in the sealing member, and extends in a direction opposite to the first circuit substrate side.

* * * * *